(12) United States Patent
Nishijima

(10) Patent No.: US 6,800,920 B2
(45) Date of Patent: Oct. 5, 2004

(54) RF PASSIVE CIRCUIT AND RF AMPLIFIER WITH VIA-HOLES

(75) Inventor: Masaaki Nishijima, Osaka (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 138 days.

(21) Appl. No.: 09/928,733

(22) Filed: Aug. 13, 2001

(65) Prior Publication Data

US 2002/0020894 A1 Feb. 21, 2002

(30) Foreign Application Priority Data

Aug. 15, 2000 (JP) ........................................ 2000-246483

(51) Int. Cl.$^7$ .......................... H01L 29/00; H01L 23/48; H01L 23/52; H01L 29/40; H01L 23/34
(52) U.S. Cl. ...................... 257/531; 257/528; 257/774; 257/728; 257/724; 257/621; 438/957; 438/329
(58) Field of Search .................... 336/68, 230, 223, 336/65, 225, 186, 187; 257/531, 535, 528, 774, 728, 724, 621, 534; 438/957, 329

(56) References Cited

U.S. PATENT DOCUMENTS 5,497,028 A * 3/1996 Ikeda et al. .................. 257/531
5,557,138 A * 9/1996 Ikeda et al. .................. 257/531
5,705,963 A * 1/1998 Ikeda et al. .................. 333/184
6,075,427 A * 6/2000 Tai et al. ..................... 333/219
6,355,535 B2 * 3/2002 Liou .......................... 438/381

FOREIGN PATENT DOCUMENTS

JP          6334974        2/1968

* cited by examiner

Primary Examiner—Nathan J. Flynn
Assistant Examiner—Victor A. Mandala, Jr.

(57) ABSTRACT

An input matching parallel inductor 114 which utilizes a spiral inductor, and an input matching parallel capacitor 115 which utilizes an MIM capacitor, both being constituting elements of an input matching circuit portion 125, form an input matching parallel capacitor 115 inside an input matching circuit via-hole 121 being formed by applying a method of surface via-hole to the front surface of a GaAs substrate 124. A choke inductor 119 which utilizes a spiral inductor, and a bypass capacitor 120 which utilizes an MIM capacitor, both being constituting elements of a drain voltage feeding circuit 107, form a bypass capacitor 120 inside a drain voltage feeding circuit via-hole 123 formed by applying a method of surface via-hole to the front surface of the GaAs substrate 124. A drain voltage terminal 136 is extended by a drawing wire 135 from between the spiral inductor and the drain voltage feeding circuit via-hole 123.

4 Claims, 8 Drawing Sheets

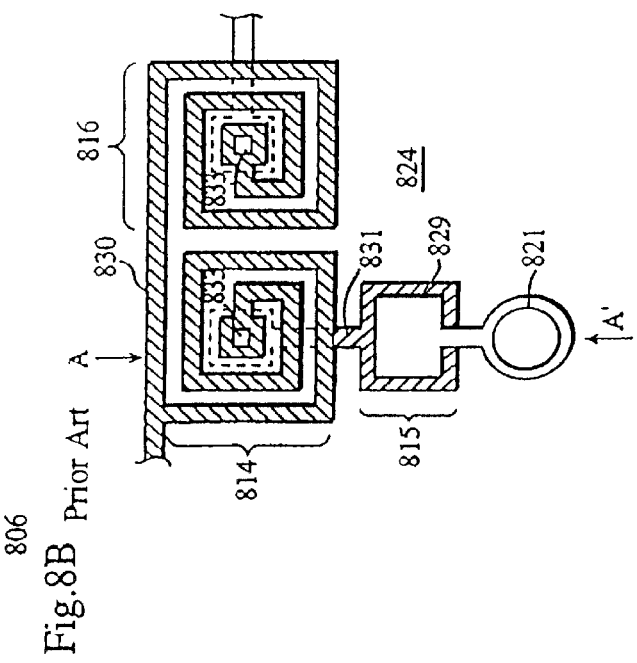
Fig.8D Prior Art
Fig.8C Prior Art
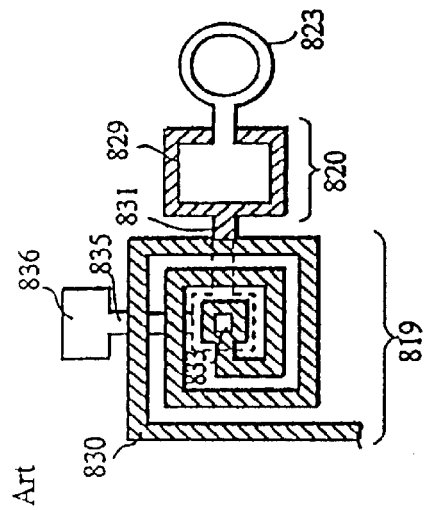
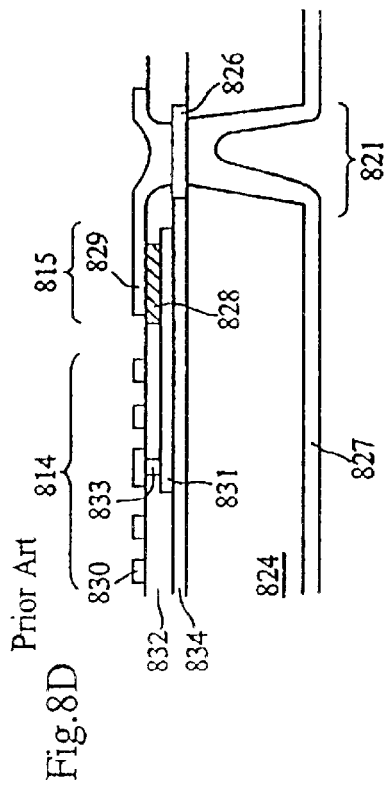
Fig.8A Prior Art
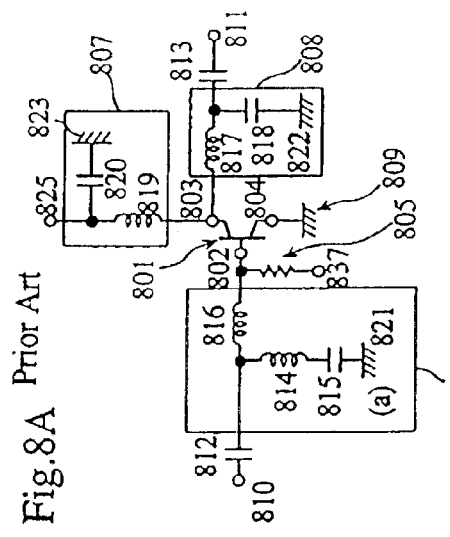
Fig.8B Prior Art

RF PASSIVE CIRCUIT AND RF AMPLIFIER WITH VIA-HOLES

BACKGROUND OF THE INVENTION (1) Field of the Invention

This invention relates to a technology for making smaller and lighter RF passive circuits and RF amplifiers equipped with via-holes.

(2) Prior Art

Recently, various types of mobile communication tools, such as portable phones or portable information terminals have been commercialized all over the world. As portable phones, cellular phones for bands of 900 MHz and 1.5 GHz, and Personal Handyphone System (PHS) for a band of 1.9 GHz are two examples that are commercialized in Japanese market. Other examples include world-famous GSM, and CDMA among the technologies adopted in PCS (Personal Communications Services) in the U.S.A.

As a third-generation mode following the analogue mode and the digital mode, IMT2000 is planned to be commercialized in the future.

In developing mobile communication terminals especially portable terminals, it is an inevitable trend to seek smaller and lighter terminals. Accordingly, it is important to achieve a technology for making smaller and lighter components for these terminals.

As a trend, it is desired to make high frequency components of the portable terminals as a monolithic microwave IC (MMIC). The MMIC, in which active elements, their matching circuits, and bias circuits are integrated on the same substrate, is more advantageous in making smaller products than a Hybrid IC which is structured to have circuits and bias electricity-feeding circuits as outside-chips.

Even using the MMIC, it is required to ground circuit elements. Conventional grounding methods include a method of wire-bonding from the surface of semiconductor substrates, and a via-hole method. It is more effective to use the via-hole method in achieving high-quality and low cost for packaging, which makes the via-hole method more frequently adopted in the MMIC.

The following is a description of an example of a conventional type of RF passive circuit and RF amplifier equipped with via-holes with reference to FIGS. 8A–8D.

FIG. 8A is a schematic circuit diagram of a conventional RF amplifier which includes RF passive circuits equipped with via-holes, and FIGS. 8B and 8C are pattern diagrams of conventional RF passive circuits both equipped with a via-hole.

As FIG. 8A shows, a source-ground type of RF amplifier is constructed by connecting: a gate bias resistance 805 and an input matching circuit 806 to a gate terminal 802; a drain voltage feeding circuit 807 and an output matching circuit 808 to a drain terminal 803; and a source terminal 804 to a ground terminal 809, in the field effective transistor (FET) 801. An input terminal 810 and an output terminal 811 are both 50 Ω impedance, and the input matching circuit 806 and the output matching circuit 808 are adjusted to 50 Ω. Further, each of an input DC cut capacitor 812 and an output DC cut capacitor 813 is inserted to the input side and the output side respectively.

The input matching circuit 806 consists of an input matching parallel inductor 814, an input matching parallel capacitor 815, and an input matching serial inductor 816. The input matching parallel capacitor 815 is grounded by an input matching circuit via-hole 821.

The output matching circuit 808 consists of an output matching serial inductor 817, and an output matching parallel capacitor 818. The output matching parallel capacitor 818 is grounded by an output matching circuit via-hole 822.

The drain voltage feeding circuit 807 consists of a choke inductor 819 and a bypass capacitor 820. The bypass capacitor 820 is grounded by a drain voltage feeding circuit via-hole 823.

FIGS. 8B and 8C are both pattern diagrams of an RF passive circuit with a via-hole; each of them shows the input matching circuit 806 and the drain voltage feeding circuit 807 respectively. FIG. 8D shows a cross-sectional view taken along line (A–A') of FIG. 8B. The following is a description of a common part between the input matching circuit 806 and the drain voltage feeding circuit 807, taking an example of the input matching circuit 806.

Constituting elements of the aforementioned input matching circuit 806 is made, as a semiconductor substrate, on a surface of a GaAs substrate 824. Both of the input matching parallel inductor 814 and the input matching serial inductor 816 are made in a spiral-electrode-pattern, and the input matching parallel capacitor 815 is made in an MIM(Metal-Insulator-Metal) capacitor pattern.

As FIG. 8D shows, the spiral-electrode-pattern is made on the GaAs substrate 824 which is covered by an insulator film 834 such as silicon oxide. Specifically, the spiral-electrode-pattern is a structure where a lower wiring metal layer 831 which is made by gold/titanium vacuum evaporation is connected to an upper wiring metal layer 830 made by gold-plating by means of a contact hole 833, with a between-layer insulator film 832 in between.

On the other hand, the MIM capacitor is a structure where an upper wiring metal 829 is formed on a dielectric layer 828 under which is an electrode extended from the lower wiring metal layer 831; the upper wiring metal 829 is made by gold/titanium vacuum evaporation and the dielectric layer 828 is titanium oxide strontium (SrTiO3:STO) with a permittivity of 100 or more. The end of the electrode extended from the upper wiring metal 829 is connected to a ground metal layer 826 which is situated on the via-hole, as FIGS. 8B and 8C show.

The input matching circuit via-hole 821 can be formed by etching from the main surface of the GaAs substrate 824 where circuit elements were made (a surface via-hole). Or, it could also be formed by etching from the other main surface (a backside via-hole). Inside the via-hole 821, an electric conducting film is conducted to a backside ground metal 829. This electric conducting film is electrically connected to the upper wiring metal 829 of the MIM capacitor through the ground metal layer 826.

Further, as depicted in FIG. 8C, constituting elements of the drain voltage feeding circuit 807 are formed, as a semiconductor substrate, on the surface of the GaAs substrate 824. As for the choke inductor 819, a spiral-electrode-pattern is used, and as for the drain voltage feeding circuit via-hole 823, either a surface via-hole or a backside via-hole is used for forming.

Note that a feeding terminal 825 is structured by extending a drain voltage terminal 836 from the lower wiring metal layer 831 through an extending wire 835.

Thus structured as above, the following constituting elements of the RF passive circuit are formed on and through the GaAs substrate: the spiral inductor, the MIM capacitor, and the via-hole. Moreover, as FIG. 8C shows, the above three elements are positioned at a different location two-dimentionally, and are connected to each other by wiring.

The elements constitute the RF amplifier with a help of the input matching circuit 808 and the drain voltage feeding circuit 807.

As seen above, the conventional type of RF amplifiers and RF passive circuits cannot be made smaller in size, due to the two-dimensional positioning of the constituting elements of the drain voltage feeding circuit 807, which inherently take much space.

SUMMARY OF THE INVENTION

Based on the stated problem, the object of the present invention is to realize smaller RF passive circuits and RF amplifiers equipped with via-holes.

To achieve the above object, the present invention is characterized by a structure of being equipped with a spiral inductor formed on a main surface of a semiconductor substrate, and a via-hole made from the main surface and through the semiconductor substrate. The via-hole is made at the position adjacent to the spiral inductor, with a dielectric layer and a wiring metal layer formed on a metal film of the via-hole so as to hold a capacity element between the metal film and the wiring metal layer, and the spiral inductor extends at one end to be electrically connected with the wiring metal layer.

The above structure enables to incorporate a capacitor in a via-hole, thereby enabling a three-dimensional location of the following three elements on one semiconductor substrate; a spiral inductor, a capacitor, and a via-hole. Thus reduced occupancy will produce an effect of enabling a smaller RF passive circuit and an RF amplifier made of the RF passive circuits as main components.

Furthermore, the RF amplifier of the present invention is characterized by a structure of utilizing the RF passive circuit equipped with the via-hole as a matching circuit, or as an RF choke in a bias feeding circuit.

Furthermore, an RF passive circuit of the present invention is equipped with a spiral inductor formed on a main surface of a semiconductor substrate and a via-hole that is made from the main surface and goes through the semiconductor substrate. The via-hole is placed adjacent to the spiral inductor, and on a metal film of the via-hole, a first dielectric layer, a first wiring metal layer, a second dielectric layer, and a second wiring metal layer are formed in this order, so as to form a first capacity element between the metal film of the via-hole and the first wiring metal layer, and a second capacity element between the first wiring metal layer and the second wiring metal layer. The present invention is further structured to have the metal film and the second wiring metal layer electrically connected so as to hold a static capacity determined by a sum of the first capacity element and the second capacity element. The present invention is further characterized by a spiral inductor extending at one end to be electrically connected to the first wiring metal layer.

This structure will help to make a smaller RF passive circuit and a smaller RF amplifier by enabling a three-dimensional location of a spiral inductor, a capacitor, and a via-hole. Moreover, a static capacity will be increased without increasing the occupancy, which will facilitate designing of such a circuit as a bias feeding circuit of an RF amplifier which inherently requires large capacity.

In addition, the RF amplifier of the present invention is characterized by utilizing the RF passive circuit equipped with a via-hole as a matching circuit, or as an RF choke of a bias feeding circuit.

Moreover, the RF passive circuit equipped with a via-hole is characterized by a metal film of the via-hole provided through a main surface of a semiconductor substrate which further extends along the main surface, and by a spiral metal layer formed on the extended part of the metal film, which works as an inductor with a dielectric layer in between. Here, the extended part of the metal film can be made in the same spiral pattern as the spiral inductor which is formed on the metal film.

The above structure enables to accommodate a static capacity where the extended part of the metal layer and the spiral metal layer face each other with a dielectric layer in between. This realizes a three-dimensional location of a spiral inductor, a capacitor, and a via-hole, thereby reducing the occupancy thereof. This also helps to make a smaller RF passive circuit, and a smaller RF amplifier.

Moreover, the RF amplifier of the present invention is characterized by utilizing the RF passive circuit equipped with a via-hole as a matching circuit, or as an RF choke of a bias feeding circuit.

In addition, the RF passive circuit equipped with a via-hole that the present invention is applied to, is characterized by making a via-hole that goes through a semiconductor substrate, and by making a dielectric layer so as to cover a metal film of the via-hole which is provided through a main surface of the semiconductor substrate, and by an inductor formed as a spiral metal layer which covers the dielectric layer so as to face against the metal film at one part, where a capacity element is held between the via-hole and the inductor.

The above structure enables a three dimensional location of a spiral inductor, a capacitor, and a via-hole from inside to the surface of the semiconductor substrate, thereby reducing the occupancy thereof, and helps to make a smaller RF passive circuit and a smaller RF amplifier.

In addition, the RF amplifier of the present invention is characterized by utilizing an RF passive circuit equipped with a via-hole as a matching circuit, or as an RF choke of a bias feeding circuit.

Moreover, the RF passive circuit with a via-hole that the present invention is applied to, is characterized by being equipped with a via-hole that goes through a semiconductor substrate from the other main surface of the semiconductor substrate, and by having a dielectric layer on a metal film of a via-hole provided through the main surface of a semiconductor substrate, and having a metal layer on the dielectric layer, and holding a capacity element between the metal film of the via-hole and the metal layer.

The above structure realizes a three dimensional location of a capacitor and a via-hole on one semiconductor substrate, thereby reducing the occupancy thereof. This realizes a smaller RF passive circuit and a smaller RF amplifier.

In addition, the RE amplifier of the present invention is characterized by electrically connecting a wiring metal layer of the RE passive circuit with a gate terminal of a common gate circuit of a EET, or with a base terminal of a common base circuit of a bipolar transistor, or by electrically connecting, with a source terminal of a FET, a terminal which is a terminal of a resistance element electrically connected to the metal layer, so as to form a self bias circuit.

In addition, the RF passive circuit of the present invention equipped with a via-hole is characterized by making a via-hole that goes through a semiconductor substrate, and by forming a dielectric layer and a wiring metal layer on a metal film of the via-hole, in this order, so as to hold a capacity element between a ground metal layer and the wiring metal layer.

The above structure enables a three dimensional location of a capacitor and a via-hole on one semiconductor substrate, thereby reducing the occupancy thereof. This helps making a smaller RF passive circuit and a smaller RF amplifier.

Moreover, the RF amplifier of the present invention is characterized by electrically connecting a wiring metal layer of the RF passive circuit with a gate terminal of a common gate circuit of a FET, or by electrically connecting the wiring metal layer with a base terminal of a common base circuit in a bipolar transistor, or by connecting a terminal of a resistance element of the RF passive circuit with the ground metal layer, and the other terminal to the wiring metal layer, so as to form a self bias circuit.

The RF passive circuit equipped with a via-hole that the present invention is applied to, is further characterized by making a via-hole that goes through a semiconductor substrate, and by forming, on a metal film of the via-hole, a first dielectric layer, a first wiring metal layer, a second dielectric layer, and a second wiring metal layer in this order. The RF passive circuit of the present invention is further characterized by having a first capacity element between the metal film and the first wiring metal layer, and the second capacity element between the first wiring metal layer and the second wiring metal layer, and by electrically connecting the metal film and the second wiring metal layer, so as to form a static capacity determined by a sum of the first capacity element and the second capacity element.

The RF amplifier of the present invention is further characterized by electrically connecting a first wiring metal layer of an RF passive circuit equipped with a via-hole with a gate terminal of a common gate circuit of a FET, or by electrically connecting a first wiring metal layer with a base terminal of a common base circuit of a bipolar transistor. Or the RF amplifier is characterized by electrically connecting one terminal of a resistance element with the metal film, and the other terminal with the first wiring metal layer, and the terminal of the resistance element which is electrically connected with the second wiring metal layer is further electrically connected with a source terminal of the FET so as to form a self bias circuit.

DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 1A is a schematic circuit diagram that the RF passive circuit of the present invention is applied to. FIG. 1B is a plan view showing an electrode pattern constituting a matching circuit which is one example of the RF passive circuit, and FIG. 1C is a plan view showing an electrode pattern constituting a bias feeding circuit which is another example of the RF passive circuit. Finally FIG. 1D is a cross-sectional view of FIG. 1B.

FIG. 2A is a schematic circuit diagram that the RF passive circuit of the present invention is applied to. FIG. 2B is a plan view showing an electrode pattern constituting a matching circuit which is one example of the RF passive circuit, and FIG. 2C is a plan view showing an electrode pattern constituting a bias feeding circuit which is another example of the RF passive circuit. Finally FIG. 2D is a cross-sectional view of FIG. 2B.

FIG. 3A is a schematic circuit diagram that the RF passive circuit is applied to. FIG. 3B is a plan view showing an electrode pattern constituting a matching circuit which is one example of the RF passive circuit, and FIG. 3C is a cross-sectional view of FIG. 3B.

FIG. 4A is a schematic circuit diagram that the RF passive circuit of the present invention is applied to. FIG. 4B is a plan view showing an electrode pattern constituting a matching circuit which is one example of the RF passive circuit, and FIG. 4C is a plan view showing an electrode pattern constituting a bias feeding circuit which is another example of the RF passive circuit. Finally FIG. 4D is a cross-sectional view of FIG. 4B.

FIGS. 5A–5C are schematic circuit diagrams of the RF amplifier respectively. FIG. 5D is a cross-sectional view of a passive circuit formed on a GaAs substrate which is applied to each circuit in FIGS. 5A–5C.

FIGS. 6A and 6B are schematic circuit diagrams of the RF amplifier, and FIG. 6C is a cross-sectional view of a passive circuit formed on a GaAs substrate which is applied to each circuit in FIGS. 6A and 6B.

FIGS. 7A and 7B are schematic circuit diagrams of the RF amplifier, and FIG. 7C is a cross-sectional view of a passive circuit formed on a GaAs substrate which is applied to each circuit in FIGS. 7A and 7B.

FIGS. 8A–8D show a conventional type of RF passive circuit and RF amplifier equipped with via-holes. FIG. 8A is a schematic diagram. FIG. 8B is a plan view showing a matching circuit formed on a substrate. FIG. 8C is a plan view showing a bias feeding circuit formed on a substrate, and FIG. 8D is a cross-sectional view of FIG. 8C.

DESCRIPTION OF THE PREFERRED EMBODIMENTS

The following is a description of RF passive circuits and RF amplifiers equipped with via-holes, which are the preferred embodiments of the present invention, with reference to the drawings.

1. First Embodiment

FIGS. 1A–1D are drawn to describe the first embodiment of the present invention.

Figure 1A:
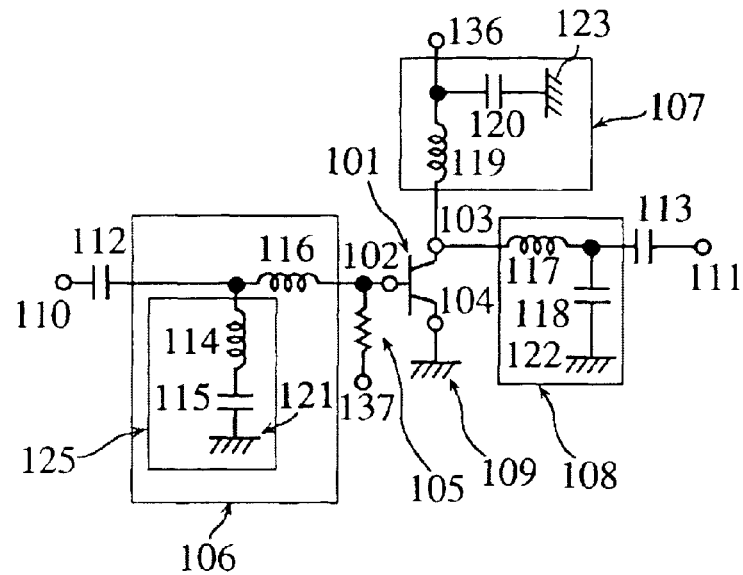
FIGS. 1A–1D show an RF passive circuit and an RF amplifier equipped with via-holes according to the first embodiment of the present invention.

FIG. 1A is a schematic circuit diagram of the RF amplifier and the RF passive circuit that the present invention is applied to. The circuit is basically the same as the one in FIG. 8A, with minor difference in reference numbers for parts and materials. Therefore description is omitted.

Figure 1B:
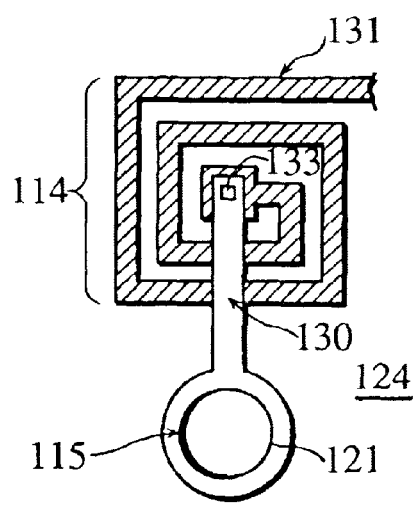
Figure 1C:
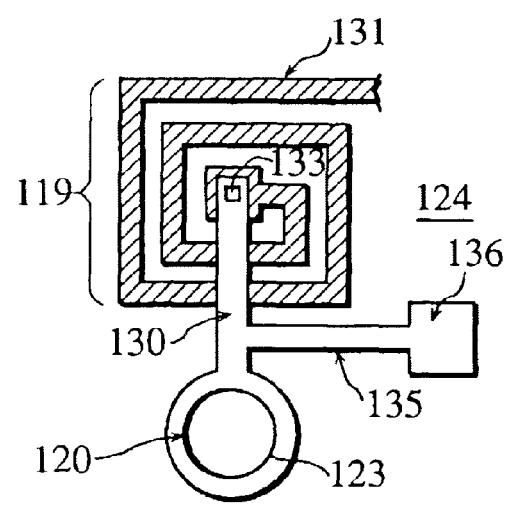

FIGS. 1B and 1C are both diagrams showing a plan view of structures realized by an input matching circuit portion 125 and a drain voltage feeding circuit 107 in FIG. 1 (1), pertaining to the first embodiment.

FIG. 1B is a plan view of the input matching circuit portion 125. An input matching parallel inductor 114 is in a spiral-electrode-pattern, and an input matching parallel capacitor 115 is an MIM capacitor and is created inside an input matching circuit via-hole 121, which is a surface via-hole made from the front surface of the GaAs substrate 124.

Figure 1D:
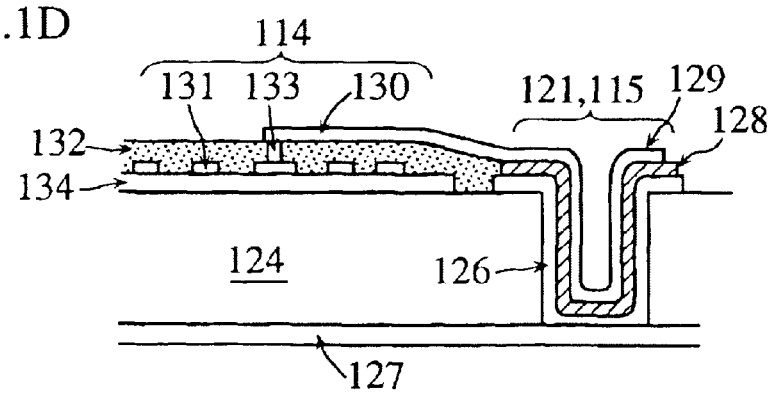

The following is a detailed description of the above-mentioned structure with reference to FIG. 1D, a cross-sectional diagram. The whole back surface of the GaAs substrate 124 is covered by the back surface metal layer 127, and an insulator layer 134 is formed such as silicon oxide on an arbitrary part on the front surface of the GaAs substrate 124. On the front surface of the GaAs substrate 124 where the insulator layer 134 is not present, a via-hole 121 is formed by etching. On the insulator layer 134, a lower wiring metal layer 131 made by gold-plating is formed in a spiral pattern, which is covered by a between-layer insulator film 132 made of silicon nitride. This is then covered by an upper wiring metal layer 130 made by gold/titanium plating. As FIG. 1B shows, the upper wiring metal layer 130 is in a linear form. The upper wiring metal layer 130 and the lower wiring metal layer 131 are connected to each other by a contact hole 133 going through the between-layer insulator film 132. Both metal layers, put together, constitute the input matching parallel inductor 114 equivalently.

The inside of the via-hole 121 is covered with a three-layer film made of: a ground metal layer 126, a dielectric layer 128, a first wiring metal layer for capacity element 129, from the bottom. The ground metal layer 126 contacts the back surface metal layer 127 on the bottom of the via-hole and it extends along the edge of the via-hole on the front surface of the GaAs substrate. The dielectric layer 128 is made of such material as titanium oxide strontium (SrTiO3: STO) whose permittivity is 100 or more. The first wiring metal layer for capacity element 129 extends on the between-layer insulator film 132 so as to merge with the upper wiring metal layer 130. The three-layer film forms the input matching parallel capacitor 115, which has a static capacity determined by the following elements: a permittivity of the dielectric layer 128, the space between the two metal layers 126 and 129, and the distance between the two layers.

The drain voltage feeding circuit 107 is structured basically the same as the input matching circuit depicted in FIG. 1B. The only difference is that a drain voltage terminal 136 is drawn from between a spiral inductor and a drain voltage feeding circuit via-hole 123 through a drawing wire 135. Further explanation is omitted accordingly.

The above structure, incorporating a capacitor into a via-hole, is more advantageous in making smaller terminals than conventional one that positions each element in different places.

Note that such devices as a bipolar transistor and a metal-oxide semiconductor field-effect transistor (MOSFET) are to be alternatively used as an active element of an RF amplifier.

Also note that although the description is confined to RF amplifiers, the present invention is applicable to other RF devices such as mixer, or VCO, too.

2. Second Embodiment

Figure 2A:
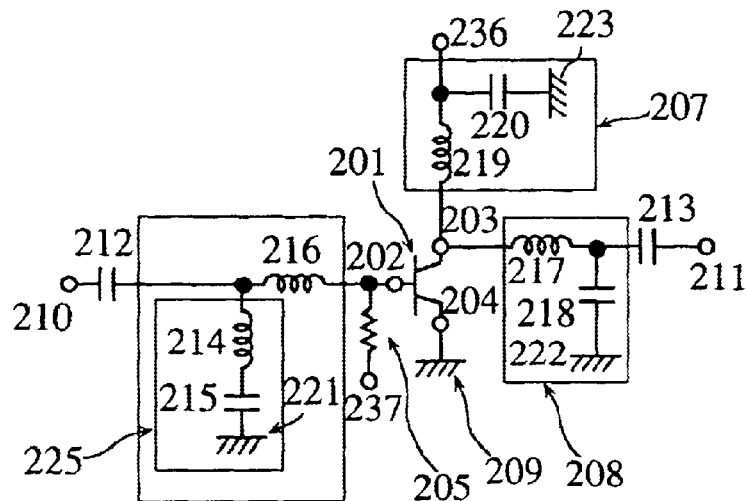
FIGS. 2A–2D show an RF passive circuit and an RF amplifier equipped with via-holes according to the second embodiment of the present invention.
Figure 2B:
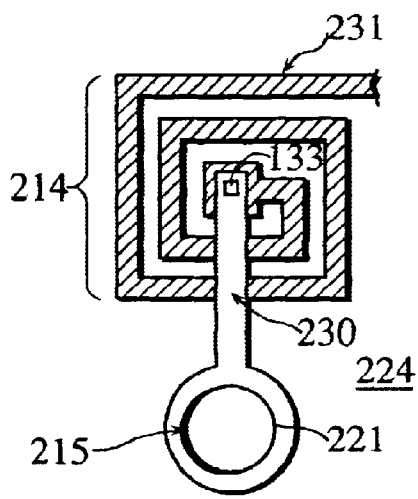
Figure 2C:
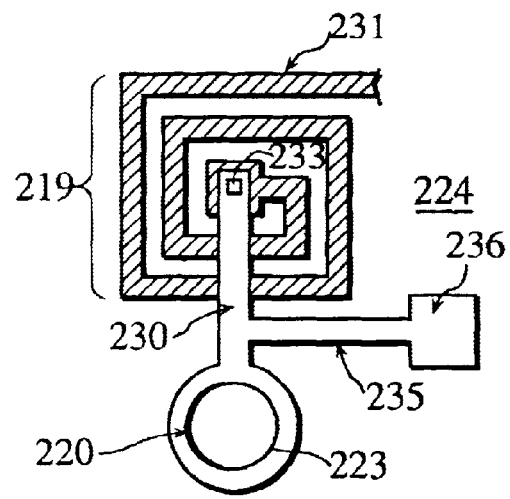
Figure 2D:
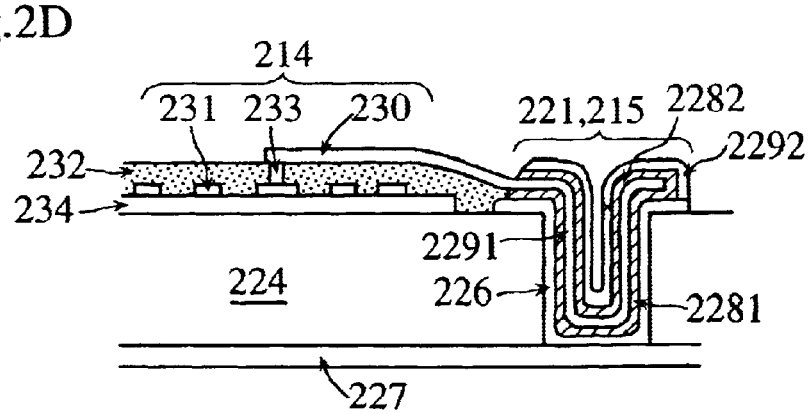

FIGS. 2A–2D are drawings depicted for the explanation of the second embodiment of the present invention. The application circuits will not be described since they are the same as those of FIG. 1A. FIG. 2B depicts an input matching circuit, and FIG. 2C depicts a drain voltage feeding circuit. FIG. 2D is a cross-sectional view of both circuits.

The second embodiment has larger static capacity than the first embodiment, realized by an input matching parallel capacitor 221 created inside a via-hole 215. That is, the second embodiment has a five-layer film inside the via-hole 215 made by stacking: a ground metal layer 226, a first dielectric layer 2281, a first wiring metal layer for capacity element 2291, a second dielectric layer 2282, and a second wiring metal layer for capacity element 2292, from the bottom. Note that the three metal layers are made of the same metal material, which is the same material used in the first embodiment. Likewise, all the two dielectric layers, in this second embodiment, are made of the same dielectric material, which is the same material as the first embodiment. The five layers are connected in some parts; the first dielectric layer 2281 and the second dielectric layer 2282 are connected at one end of both layers above the GaAs substrate, over which the ground metal layer 226 and the second wiring metal layer for capacity element 2292 are connected.

This structure enables nearly twice as much space as the first embodiment where the metal layers face each other, since both the ground metal layer 226 and the second wiring metal layer for capacity element 2292 are structured to face against the first wiring metal layer for capacity element 2291. Therefore, if the permittivity of the dielectric layer is the same, the static capacity will be nearly twice as large as the first embodiment. Moreover, it does not damage the advantage in making smaller terminals since the total occupancy stays the same as the first embodiment.

3. Third Embodiment

Figure 3A:
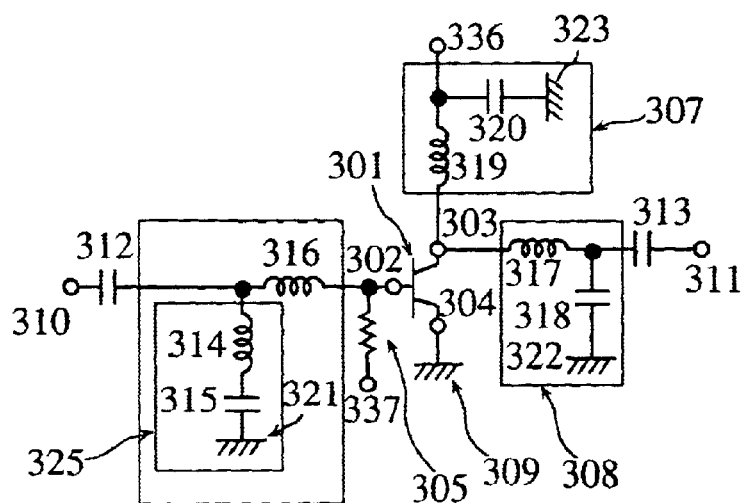
FIGS. 3A–3C show an RF passive circuit and an RF amplifier equipped with via-holes according to the third embodiment of the present invention.
Figure 3B:
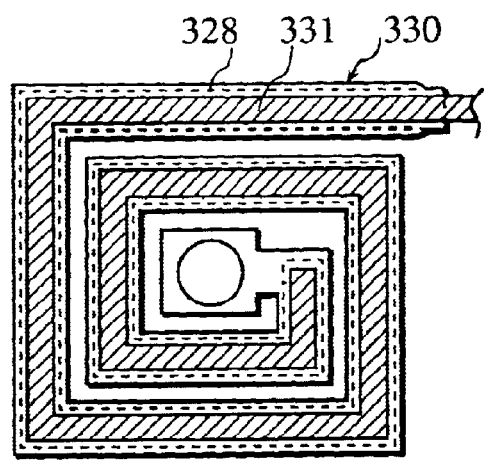
Figure 3C:
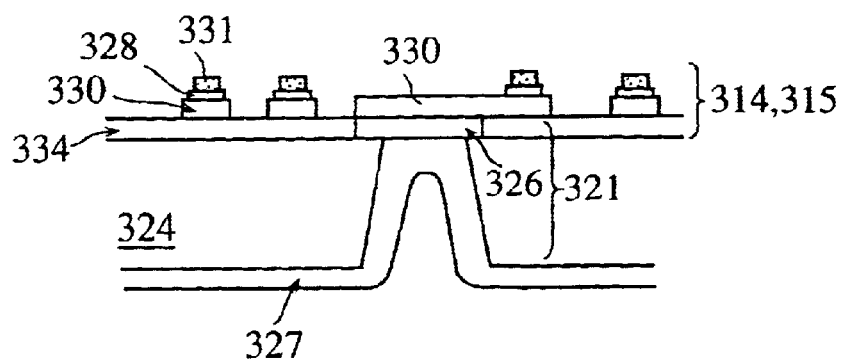

FIGS. 3A–3C are depicted for the explanation of the third embodiment.

FIG. 3A is a plan view showing a schematic circuit diagram for an RF amplifier the third embodiment is applied to. The circuits are the same as those depicted in FIG. 8A, whose description is omitted accordingly.

FIG. 3B shows a plan view of an input matching circuit portion 325 and a drain voltage feeding circuit 307, both as parts of an RF amplifier of the third embodiment. FIG. 3C is a cross-sectional view of FIG. 3B.

The following focuses on the input matching circuit portion 325 for detailed description.

First, a first wiring metal layer 330 is formed by gold/titanium vacuum evaporation in a spiral pattern seen from the above; it is formed so as to cover an insulator film 334 made of such materials as silicon oxide on a GaAs substrate 324. Next, a dielectric layer 328 made of titanium oxide strontium which has a permittivity of 100 or more is applied on the first wiring metal layer 330, in just about the same form as the first wiring metal layer 330, seen from the above. Then, the dielectric layer 328, in turn, is covered by a second wiring metal layer 331 made by gold-plating or gold/titanium vacuum evaporation, also in just about the same form as the rest. The center of the spiral of the first wiring metal layer 330 is connected, at the end, to a ground metal layer 326 above the via-hole, and is grounded by the ground metal layer 326 and the via-hole.

The third embodiment enables to have an input matching parallel capacitor 315 since the first wiring metal layer 330 is structured to face the second wiring metal layer 331 with the dielectric layer 328 in between. Moreover with this embodiment, the second wiring metal layer 331 is structured also to work as an inductor against high frequencies, as formed spirally and lengthy. Accordingly, the structure of FIGS. 3B and 3C, by grounding the capacitor at one end and connecting to an inductor at the other end, enables the input matching circuit portion 325 and the drain voltage feeding circuit 307 equivalently.

4. Fourth Embodiment

FIGS. 4A–4D are drawn to describe the fourth embodiment of the present invention.

Figure 4A:
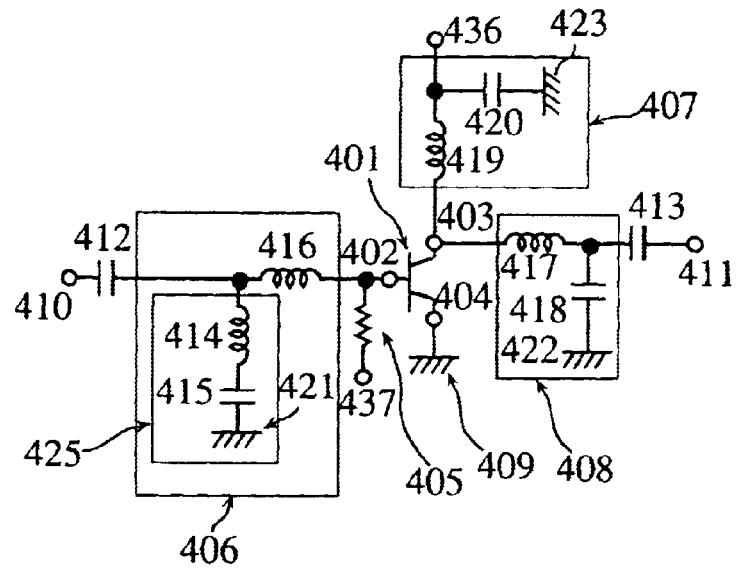
FIGS. 4A–4D show an RF passive circuit and an RF amplifier equipped with via-holes according to the fourth embodiment of the present invention.

FIG. 4A is a schematic circuit diagram for an RF passive circuit and an RF amplifier that this embodiment is applied to. The circuit in FIG. 4A is the same as FIG. 8A as self-explanatory, which does not probably need further explanation.

Figure 4B:
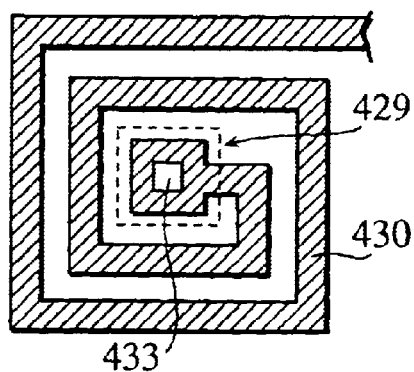
Figure 4C:
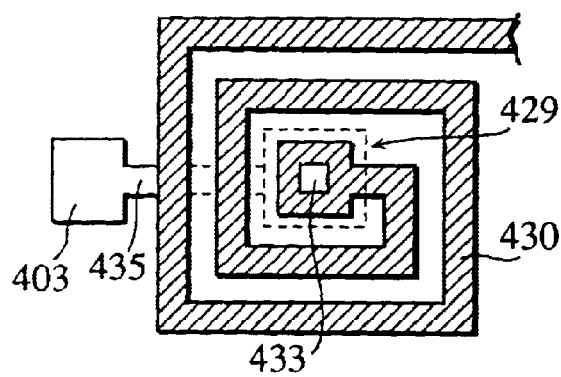
Figure 4D:
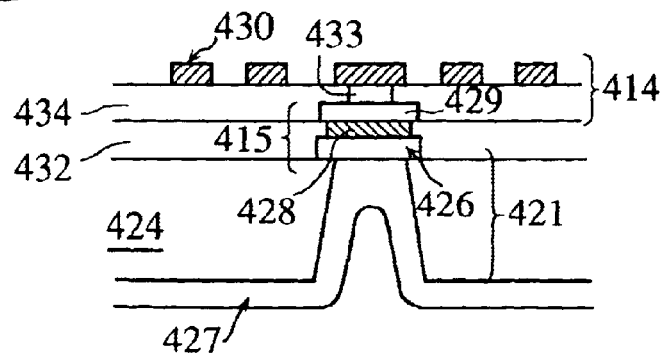

FIGS. 4B and 4C are plan views showing an input matching circuit portion 425 and a drain voltage feeding circuit 407 respectively, both showing their circuit patterns, and FIG. 4D is a cross-sectional diagram thereof. The following description is confined to the input matching circuit portion, since it has many parts in common with the drain voltage feeding circuit 407.

An input matching circuit via-hole 421 is placed underneath the center of the spiral of an input matching parallel inductor 414.

The input matching circuit via-hole 421 is made using a backside via-hole method from the back of the GaAs substrate 424. The ground metal layer 426, made by gold-plating or gold/titanium vacuum evaporation, is on the via-hole 421 and is conducted to the backside ground metal layer 427.

On the ground metal layer 426, a dielectric layer 428 made of titanium oxide strontium (SrTiO3:STO) with a permittivity of 100 or more is formed, which has approximately the same form as the ground metal layer 426 seen from the above. On this dielectric layer 428, in turn, a lower wiring metal 429 is formed by gold/titanium vacuum evaporation. An MIM capacitor formed by the ground metal layer 426, the dielectric layer 428, and the lower wiring metal 429 put together, makes an input matching parallel capacitor 415.

Around the MIM capacitor and on the GaAs substrate 424, a between-layer insulator film 432 and an insulator film 434 made of silicon oxide for example are formed, which are then covered by an upper wire 430 in a spiral pattern made by such method as gold/titanium vacuum evaporation method. The center of the upper wire 430 is conducted to the lower wiring metal 429 via a contact hole 433. The upper wire 430 and the lower wiring metal 429 form a spiral-formed inductor.

The fourth embodiment, just as the third embodiment, grounds one end of the capacitor, while connecting the other end to the inductor, which forms equivalently the input matching circuit portion 425 depicted in FIG. 4A.

5. Fifth Embodiment

FIGS. 5A–5D are drawn to describe the fifth embodiment of the present invention.

Figure 5A:
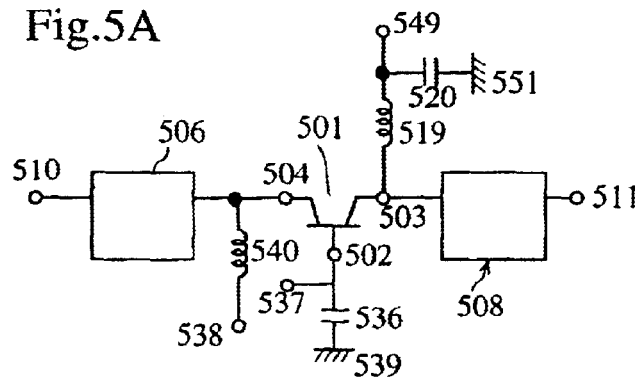
FIGS. 5A–5D show an RF passive circuit and an RF amplifier equipped with via-holes according to the fifth embodiment of the present invention.

FIG. 5A shows a schematic circuit diagram of an RF amplifier that the fifth embodiment is applied to.

The RF amplifier depicted in FIG. 5A uses a common gate type FET. A bypass capacitor 536 and a gate voltage terminal 537 are connected to a gate terminal 502 of a FET 501; the bypass capacitor 536 is grounded by a ground via-hole 539. An input matching circuit 506 and a choke inductor 540 are connected to a source terminal 504, and at the terminal of the choke inductor 540, a source voltage terminal 538 is connected. A drain terminal 503 is connected to an output matching circuit 508, a choke inductor 519, and a bypass capacitor 520. An input terminal 510 and an output terminal 511 are both 50 Ω impedance, and the input matching circuit 506 and the output matching circuit 508 are adjusted to 50 Ω.

The structures described in the first, second, third, and fourth embodiments, are applicable to the input matching circuit 506 and the output matching circuit 508.

Figure 5B:
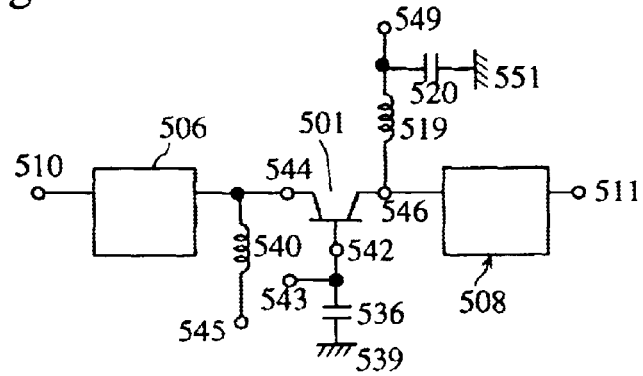

FIG. 5B is a schematic circuit diagram showing an RF amplifier using a common base type bipolar transistor. A bypass capacitor 536 and a base voltage terminal 543 are connected to a base terminal 542 of a bipolar transistor 541. The bypass capacitor 536 is grounded by the ground via-hole 539. An input matching circuit 506 and a choke inductor 540 are connected to an emitter terminal 544. At the terminal of the choke inductor 540, an emitter voltage terminal 545 is connected. Finally an output matching circuit 508, a choke inductor 519, and a bypass capacitor 520 are connected to a collector terminal 546. Both of an input terminal 510 and an output terminal 511 are 50Ω impedance, and both of the input matching circuit 506 and the output matching terminal 508 are adjusted to 50Ω.

The structures described in the first, second, third, and fourth embodiments are applicable to the input matching circuit 506 and the output matching circuit 508.

Figure 5C:
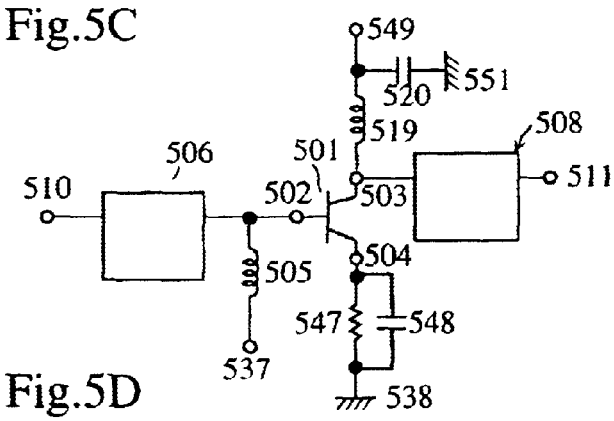

FIG. 5C is a schematic circuit diagram showing an RF amplifier using a source ground type FET which uses a self-bias method. A gate bias resistance 505 and an input matching circuit 506 are connected to a gate terminal 502 of a FET 501. A self bias resistance 547 and a self bias bypass capacitor 548 are connected to a source terminal 504, which is grounded by a ground via-hole 538. Finally an output matching circuit 508 a choke inductor 519, and a bypass capacitor 520 are connected to a drain terminal 503. An input terminal 510 and an output terminal 511 are both 50Ω impedance, and the input matching circuit 506 and the output matching circuit 508 are adjusted to 50Ω.

The structures described in the first, second, third, and fourth embodiment are applicable to the input matching circuit 506 and the output matching circuit 508.

Figure 5D:
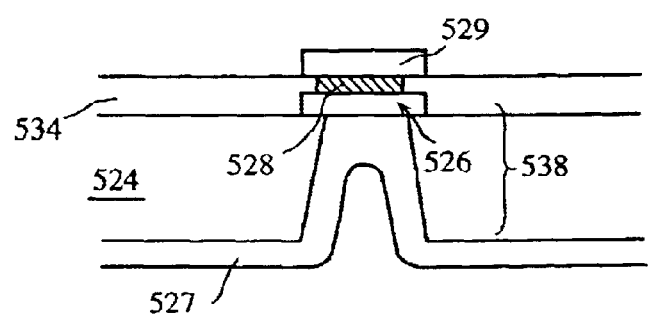

FIG. 5D is a cross-sectional view of a circuit pattern constituting a capacitor grounded by a via-hole at one end.

The ground via-hole 539 depicted in FIGS. 5A–5C is made by a backside via-hole method from the back of the GaAs substrate 524. The ground metal layer 526, made by gold-plating or gold/titanium vacuum evaporation, is conducted to the backside ground metal layer 527 of the GaAs substrate 524.

A dielectric layer 528 which is made of titanium oxide strontium (SrTiO3:STO) with a permittivity of 100 or more is formed on the ground metal layer 526. On this dielectric layer 528, a wiring metal 529 is formed by such method as gold/titanium vacuum evaporation. A bypass capacitor 536 and a self bias bypass capacitor 548 are formed using a MIM capacitor, which is obtained by combining the ground metal layer 526, the dielectric layer 528, and the wiring metal 529.

The circuit structure depicted in FIGS. 5A and 5B is obtained by electrically connecting the wiring metal 529 and the gate terminal 502.

Furthermore, the circuit structure in FIG. 5C is obtained by electrically connecting one end of the self bias resistance 547 to the wiring metal 529, and the other end to the ground metal layer 526. Or, the circuit structure is alternatively obtained by using the insulator layer 534 formed around the dielectric layer 528 as a resistance layer, substituting it for the self bias resistance 547.

The fifth embodiment is structured to enable to make smaller terminals by placing the via-hole and the capacitor in the same position on the substrate.

6. Sixth Embodiment

Figure 6A:
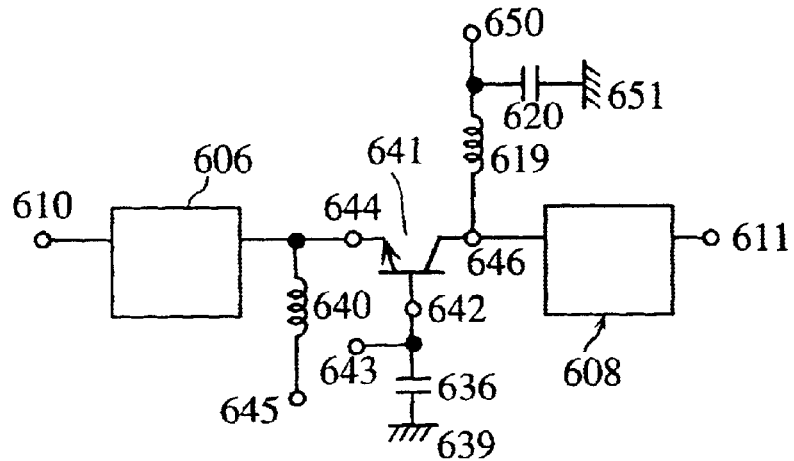
FIGS. 6A–6C show an RF passive circuit and an RF amplifier equipped with via-holes according to the sixth embodiment of the present invention.
Figure 6B:
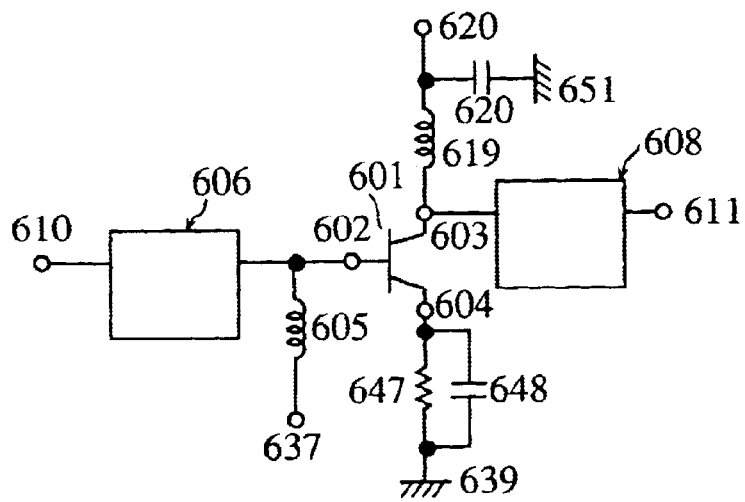
Figure 6C:
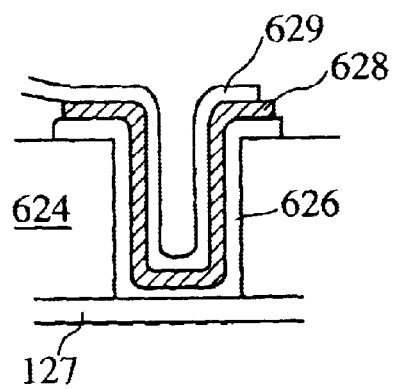

FIGS. 6A–6C are drawn to explain the sixth embodiment. FIG. 6A shows an RF amplifier that the sixth embodiment is applied to.

FIGS. 6A and 6B are the same as FIGS. 5A and 5B respectively. Explanation of the circuit pertaining FIGS. 6A and 6B is omitted accordingly.

The circuit described in the first, second, third, and fourth embodiments of the present invention (i.e. FIGS. 1A, 2A, 3A, and 4A) is applicable to an input matching circuit 606 and an output matching circuit 608.

A ground via-hole 638 depicted in FIGS. 6A–6C is formed by a surface via-hole method from the front surface of a GaAs substrate 624. Inside the ground via-hole 638, a bypass capacitor 636 and a self bias bypass capacitor 648 are formed. A ground metal layer 626 is formed, by gold-plating or gold/titanium vacuum evaporation, both inside and around the via-hole on the GaAs substrate 624. The ground metal layer 626 is conducted to a backside ground metal layer 627 on the GaAs substrate 624. A dielectric layer 628 made of titanium oxide strontium (SrTiO3:STO) which has a permittivity of 100 or more is formed on the ground metal layer 626. On the dielectric layer 628, in turn, a first wiring metal layer for capacity element 629 is formed by such method as a gold/titanium vacuum evaporation method. From the above, a bypass capacitor 636 and a self bias bypass capacitor 648 are formed as capacitor elements, by the ground metal layer 626, the first wiring metal layer for capacity element 629, and the dielectric layer 628.

7. Seventh Embodiment

Figure 7A:
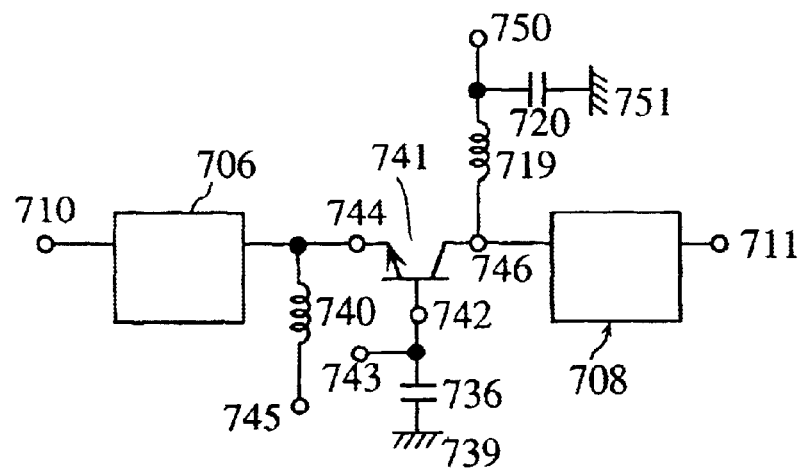
FIGS. 7A–7C show an RF passive circuit and an RF amplifier equipped with via-holes according to the seventh embodiment of the present invention.
Figure 7B:
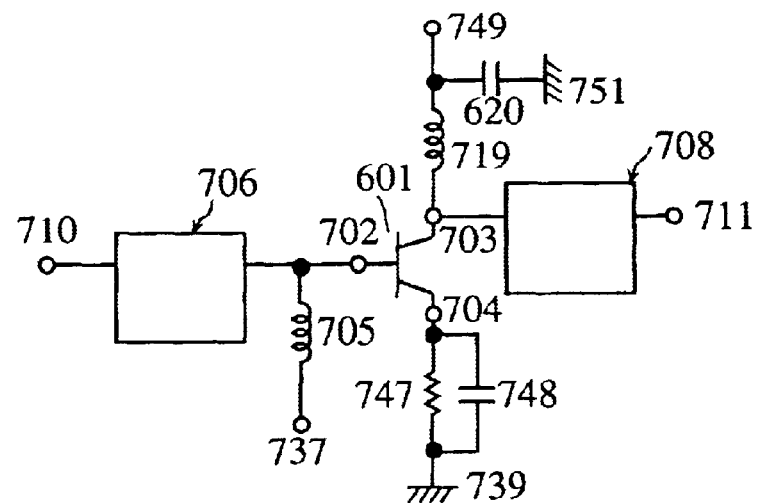
Figure 7C:
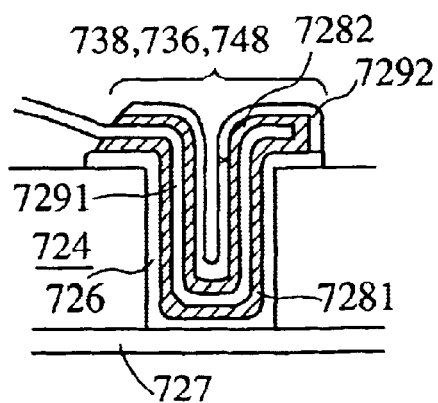

FIGS. 7A–7C show the seventh embodiment of the present invention, which has a larger capacitor than the sixth embodiment.

The seventh embodiment is mostly the same as the sixth embodiment except how the capacitor is structured. The following description focuses on this point accordingly.

As FIG. 7C shows, a ground via-hole 738 is made from the front surface of a GaAs substrate 724 using a surface via-hole method, so as to form a bypass capacitor inside. A ground metal layer 726 is made inside the ground via-hole 738 and also around the upper part thereof by gold-plating or gold/titanium vacuum evaporation. The ground metal layer is conducted to a backside ground metal layer 727. On the ground metal layer 726, a first dielectric layer 7281 is formed which is made of titanium oxide strontium (SrTiO3:STO) with a permittivity of 100 or more. Then, on this first dielectric layer 7281, a first wiring metal layer for capacity element 7291 is made by such method as gold/titanium vacuum evaporation.

Further, on the first wiring metal layer for capacity element 7291, a second dielectric layer 7282 is formed made of titanium oxide strontium (SrTiO3:STO) with a permittivity of 100 or more, which is in turn covered by a second wiring metal layer for capacity element 7292 made by such method as gold/titanium vacuum evaporation. Note that the ground metal layer 726 and the second wiring metal layer for capacity element 7292 are electrically connected.

The seventh embodiment is thus structured to create two capacity elements; the first capacity element by means of the ground metal layer 726, the first wiring metal layer for capacity element 7291, and the first dielectric layer 7281; and the second capacity element by means of the first wiring metal layer for capacity element 7291, the second wiring metal layer for capacity element 7292, and the second dielectric layer 7282. From equivalent circuit point of view, a bypass capacitor is created by connecting the first capacity element and the second capacity element in parallel (i.e. the capacity being a sum of the first and the second capacity elements).

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. An RF passive circuit comprising:

a semiconductor substrate;

a via-hole through the semiconductor substrate, the via-hole having a metal film on an inside wall;

a wiring metal layer formed in a spiral pattern with an inside end on the semiconductor substrate, the wiring metal layer being electrically connected to the via-hole at the inside end;

an inductor of metal film formed in a spiral pattern with an inside end on the wiring metal layer with the inside end of the inductor film being near the via-hole; and a dielectric layer between the spiral wiring metal layer and the spiral inductor metal film, wherein the spiral wiring metal layer and the spiral inductor metal film are disconnected from each other near the via-hole.

2. The RF passive circuit of claim 1, wherein the wiring metal layer is formed by an evaporation process.

3. The RF passive circuit of claim 1, wherein the inside end of the wiring metal layer is connected to the via-hole by a ground layer over one en of the via-hole on the semiconductor substrate.

4. An RF choke used in at least one of a matching circuit and a bias feeding circuit, both circuits being included in an RF amplifier, the RF choke comprising:

a semiconductor substrate where at least one of the matching circuit and the bias feeding circuit is incorporated;

a via-hole through the semiconductor substrate, the via-hole having a metal film on an inside wall;

a wiring metal layer formed in a spiral pattern with an inside end on the semiconductor substrate, the wiring metal layer being electrically connected to the via-hole at the side end;

an inductor of metal film formed in a spiral pattern with an inside end on wiring metal layer with the inside end of the inductor film being near the via-hole; and a dielectric layer between the spiral wiring metal layer and the spiral inductor metal film, wherein the spiral wiring metal layer and the spiral inductor metal film are disconnected from each other near the via-hole.

* * * * *